(12) United States Patent
Lee et al.

(10) Patent No.: US 8,765,612 B2
(45) Date of Patent: Jul. 1, 2014

(54) DOUBLE PATTERNING PROCESS

(75) Inventors: Jenn-Wei Lee, Taipei (TW); Hung-Jen Liu, New Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 13/615,669

(22) Filed: Sep. 14, 2012

(65) Prior Publication Data

US 2014/0080305 A1   Mar. 20, 2014

(51) Int. Cl.
*H01L 21/302* (2006.01)

(52) U.S. Cl.
USPC ............. 438/736; 438/703; 438/717; 216/41; 216/47; 216/49; 257/E21.314; 257/E21.235; 430/312; 430/313; 430/322; 430/323; 430/324; 430/325

(58) Field of Classification Search
CPC combination set(s) only.
See application file for complete search history.

(56) References Cited

U.S. PATENT DOCUMENTS

2009/0283762 A1* 11/2009 Kimura ........................ 257/43
2011/0281220 A1* 11/2011 Matsuda ...................... 430/325

* cited by examiner

*Primary Examiner* — Lan Vinh
*Assistant Examiner* — Jiong-Ping Lu
(74) *Attorney, Agent, or Firm* — Jianq Chyun IP Office

(57) ABSTRACT

A double patterning process is described. A substrate having a first area and a second area is provided. A target layer is formed over the substrate. A patterned first photoresist layer is formed over the target layer, wherein the patterned first photoresist layer has openings and has a first thickness in the first area, and at least a portion of the patterned first photoresist layer in the second area has a second thickness less than the first thickness. A second photoresist layer is then formed covering the patterned first photoresist layer and filling in the openings.

16 Claims, 4 Drawing Sheets

DOUBLE PATTERNING PROCESS

BACKGROUND OF THE INVENTION

1. Field of Invention

This invention relates to an integrated circuit (IC) process, and more particularly relates to a double patterning process.

2. Description of Related Art

Along with the rapid development of the IC industry, the requirement on device integration unceasingly gets higher, so the dimensions of devices and the pitch of device patterns always have to be reduced. The pattern pitch can be reduced by increasing the lithographic pitch resolution, but such an increase usually costs much. To overcome the pattern-density limitation caused by the pitch resolution, the so-called double patterning technique is proposed to increase the integration degree of devices.

In a double patterning process, two cycles of photoresist coating, exposure and development are performed over a mask layer to transfer two different sets of patterns onto the mask layer. Thus, the pitch of the total patterns can be smaller than the pitch resolution value of a single exposure process.

However, because the distribution of the first set of patterns defined from the first photoresist layer is not uniform over the memory cell area and the peripheral area of the substrate, the thickness of the second photoresist layer as coated is not uniform in the cell area. As a result, the accuracy of the pattern transfer to the second photoresist layer and the underlying target layer is lowered. Thus, a method capable of uniformly coating the second photoresist layer in a double patterning process is desired.

SUMMARY OF THE INVENTION

Accordingly, this invention provides a double patterning process that allows the second photoresist layer to be coated in a more uniform thickness.

The double patterning process of this invention is described below. A substrate having a first area and a second area is provided. A target layer is formed over the substrate. A patterned first photoresist layer is formed over the target layer, wherein the patterned first photoresist layer has a plurality of openings and has a first thickness in the first area, and at least a first portion of the patterned first photoresist layer in the second area has a second thickness less than the first thickness. A second photoresist layer is formed covering the patterned first photoresist layer and filling in the openings.

In an embodiment of this invention, the patterned first photoresist layer in the second area further includes a second portion that is located adjacent to the first area, has the first thickness and is contiguous with the first portion.

In an embodiment of this invention, the patterned first photoresist layer can be defined by a photomask of which the area corresponding to the second area of the substrate has a transparency lower than that of the areas corresponding to the openings in the patterned first photoresist layer in the first area. Such a photomask may be a tri-tone photomask.

In an embodiment of this invention, the double patterning process further includes patterning the second photoresist layer to form a plurality of patterns in the openings in the patterned first photoresist layer in the first area, and patterning the target layer using the patterned first and second photoresist layers as a mask.

By making the patterned first photoresist layer have different thicknesses in the first area and the second area, the process of this invention allows the second photoresist layer as coated to have a more uniform thickness in the entire first area, so that the accuracy of the pattern transfer to the second photoresist layer and the underlying target layer is improved.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention.

FIGS. 1A-1E illustrate, in a cross-sectional view, a double patterning process according to the first embodiment of this invention.

Figure 1A:
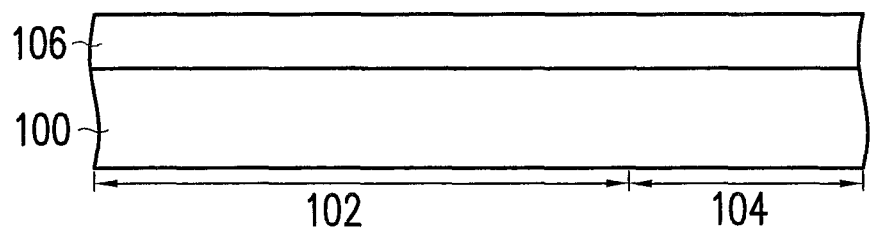
FIGS. 1A-1E illustrate, in a cross-sectional view, a double patterning process according to a first embodiment of this invention.

Referring to FIG. 1A, a substrate 100 having a first area 102 and a second area 104 is provided, possibly being a silicon substrate. In an exemplary embodiment, the first area 102 is a memory cell area and the second area 104 is a peripheral area. A target layer 106 is then formed over the substrate 100. The target layer 106 may include a conductor material, a semiconductor material or a dielectric material.

Figure 1B:
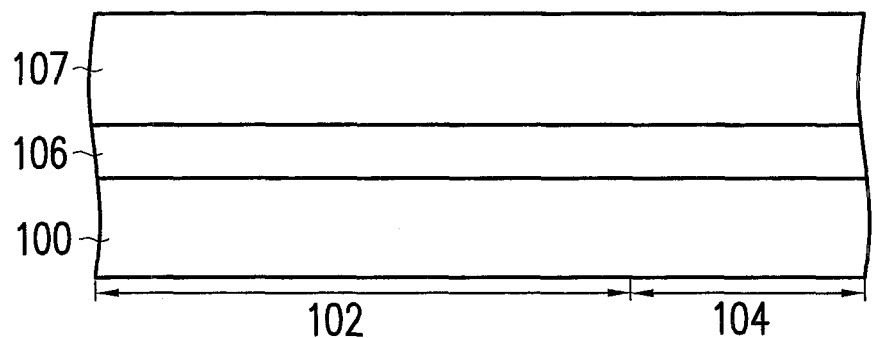

Referring to FIG. 1B, a first photoresist layer 107 is formed over the target layer 106, possibly by spin-coating. The first photoresist layer 107 may include a positive or negative photoresist material, on which the type of the photomask patterns depends. Though the case using a positive photoresist layer is described in the embodiments of this invention, this invention is not limited thereto.

Figure 1C:
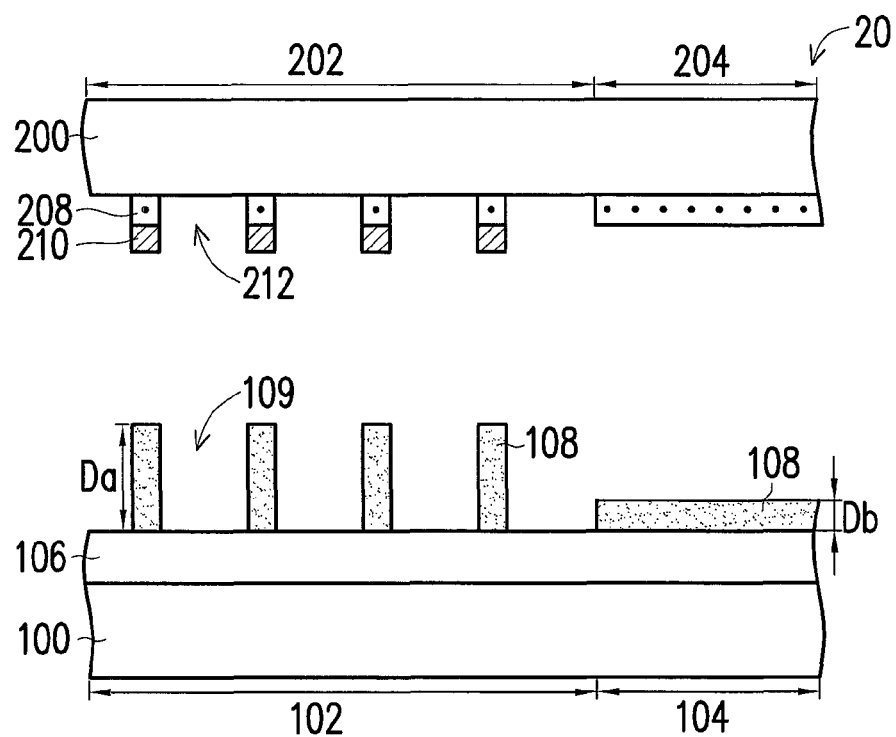

Referring to FIG. 1C, a photomask 20 is used to expose the first photoresist layer 107, and then a development step is performed to form a patterned first photoresist layer 108. The patterned first photoresist layer 108 has therein a plurality of openings 109 in the first area 102. The patterned first photoresist layer 108 in the second area 204 has a thickness Db less than the thickness Da of the patterned first photoresist layer 108 in the first area 102. In an exemplary embodiment, Db is within the range of 30% to 70% of Da. It is noted that the drawings are intended to explain this invention only but not to limit the scope of this invention. Accordingly, the ratio of Db to Da as shown in FIG. 1C can be different from that in a real case, and the ratio in a real case can be adjusted according to the pattern distribution of the patterned first photoresist layer 108 and/or other factors. In addition, though in FIG C the thickness Db of the entire patterned first photoresist layer 108 in the second area 104 is uniform and less than the thickness Da of the patterned first photoresist layer 108 in the first area 102, this invention is not limited thereto.

In addition, in an exemplary embodiment, the photomask 20 may be a tri-tone photomask that includes a transparent substrate 200, a first semi-transparent layer 208 and a second semi-transparent layer 210. The transparent substrate 200 has a third area 202 corresponding to the first area 102 of the substrate 100, and a fourth area 204 corresponding to the second area 104 of the substrate 100.

The first semi-transparent layer 208 is disposed on the third area 202 and the fourth area 204 of the transparent substrate 200, and is patterned in the third area 202 but not patterned in the fourth area 204. The second semi-transparent layer 210 is disposed on the patterned first semi-transparent layer 208 in the third area 202. In the third area 202, the first semi-transparent layer 208 and the second semi-transparent layer 210 have therein a plurality of openings 212 corresponding to the openings 109 in the first area 102 of the substrate 100 and exposing portions of the underlying transparent substrate 200.

The transparency of the transparent substrate 200, the transparency of the first semi-transparent layer 208 and the transparency of the second semi-transparent layer 210 are different from each other. In an exemplary embodiment, the transparency of the transparent substrate 200 is higher than that of the first semi-transparent layer 208, and the transparency of the first semi-transparent layer 208 is higher than that of the second semi-transparent layer 210. For example, it is possible that the transparency of the first semi-transparent layer 208 ranges from 20% to 60% and that of the second semi-transparent layer 210 ranges from 30% to 70%. The transparent substrate 200 may include quartz or other transparent material. The first semi-transparent layer 208 may be a molybdenum silicon nitride ($MoSi_xN_y$) layer. The second semi-transparent layer 210 may be a $MoSi_xN_y$ layer with a different combination of x and y.

Because the fourth area 204 of the transparent substrate 200 is entirely disposed with the first semi-transparent layer 208 while the openings 212 in the third area 202 expose portions of the transparent substrate 200, the transparency of the fourth area 204 of the photomask 20 is lower than that of the openings 212 in the third area 202 of the photomask 20.

More specifically, the portions of the first photoresist layer 107 corresponding to the second semi-transparent layer 210 of the photomask 20 are slightly exposed and therefore almost not removed in the development. The portions of the first photoresist layer 107 corresponding to the openings 212 of the photomask 20 are highly exposed due to the high transparency of the transparent substrate 200 and thus entirely removed in the development to form the openings 109. The portion of the first photoresist layer 107 corresponding to the fourth area 204 of the photomask 20 is relatively poorly exposed due to the lower transparency of the fourth area 204 and therefore partially removed in the development to form a thinner photoresist layer 108 with the thickness Db in the second area 104.

Though the patterned first photoresist layer 108 is formed with the above method in this embodiment, the method of forming the patterned first photoresist layer 108 is not limited thereto in this invention.

Figure 1D:
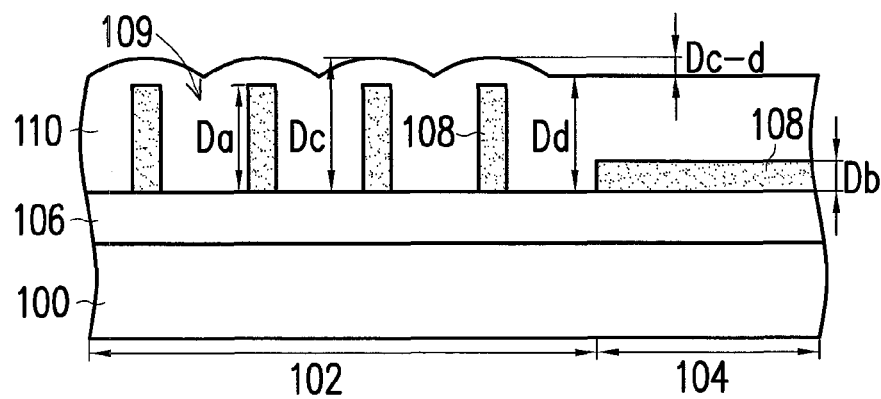

Referring to FIG. 1D, a second photoresist layer 110 is then formed covering the patterned first photoresist layer 108 and filling in the openings 109. The second photoresist layer 110 may be formed by spin-on coating. Because the thickness Db of the patterned first photoresist layer 108 in the second area 104 is less than the thickness Da of the same in the first area 102, the second photoresist layer 110 has a substantially uniform top level in the first area 102 and the second area 104. Though in the figure the thickness Dc of the second photoresist layer 110 in the first area 102 is greater than the sum Dd of the thickness Db of the patterned first photoresist layer 108 and the thickness of the second photoresist layer 110 in the second area 104, this invention is not limited thereto. In another exemplary embodiment, the thickness of the second photoresist layer 110 in the first area 102 is less than the sum of the thickness of the patterned first photoresist layer 108 and the thickness of the second photoresist layer 110 in the second area 104.

Moreover, in an exemplary embodiment, the sum Dd of the thickness Db of the patterned first photoresist layer 108 and the thickness of the second photoresist layer 110 in the second area 104 of the substrate 100 is within the range of 85% to 95% of the thickness Dc of the second photoresist layer 110 in the first area 102. In another exemplary embodiment, the difference Dc-d between the sum Dd of the thickness Db of the patterned first photoresist layer 108 and the thickness of the second photoresist layer 110 in the second area 104 and the thickness Dc of the second photoresist layer 110 in the first area 102 is within the range of 50-150 angstroms.

Figure 1E:
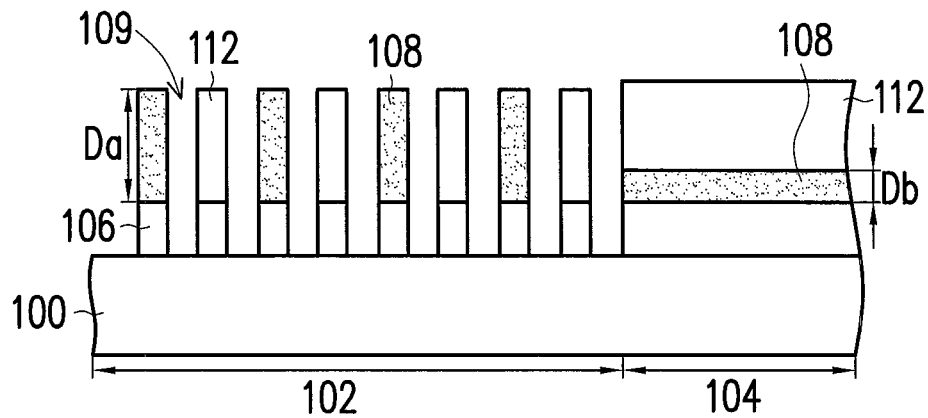

Referring to FIG. 1E, the second photoresist layer 110 is patterned to form a plurality of patterns 112 in the openings 109 in the patterned first photoresist layer 108 in the first area 102. Thereafter, the target layer 106 is patterned using the patterned first photoresist layer 108 and the patterned second photoresist layer 112 as a mask to form patterns with a higher distribution density than the patterns of the patterned photoresist layer 108 or 112.

According to the first embodiment of this invention, a patterned first photoresist layer 108 having a less thicknesses (Db<Da) in the second area 104 than in the first area 102 (Da) is formed by using the photomask 20, so that the second photoresist layer 110 coated later can have a substantially uniform top level in the entire first area 102. As a result, the pattern transfer to the second photoresist layer 110 and the underlying target layer 106 is more accurate.

Figure 2A:
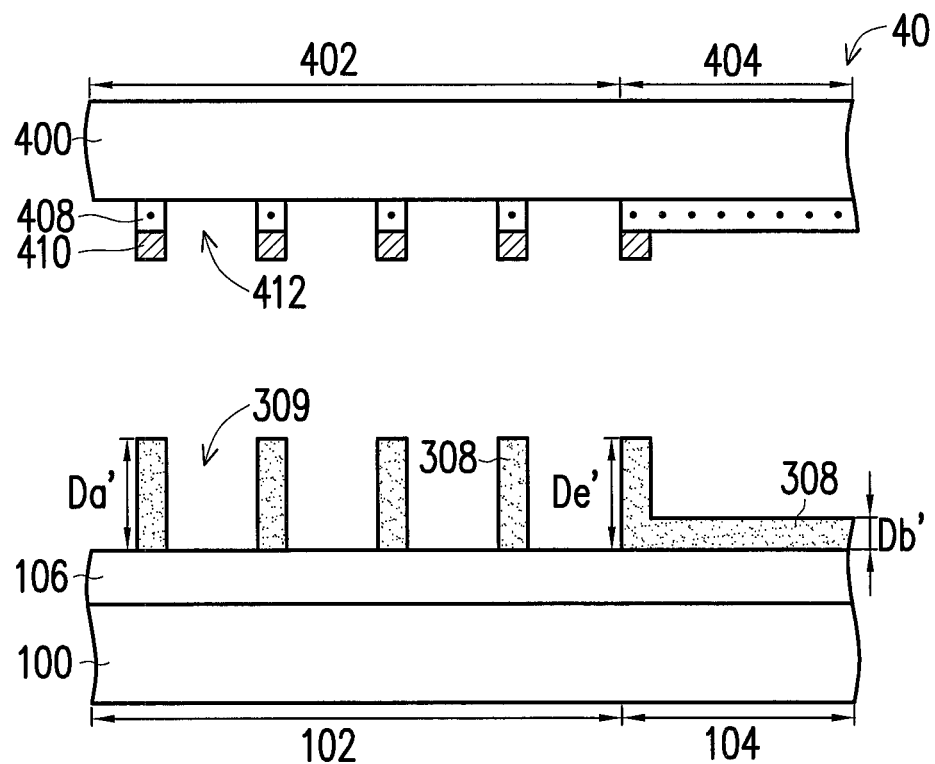
FIGS. 2A-2C illustrate, in a cross-sectional view, a double patterning process according to a second embodiment of this invention.
Figure 2B:
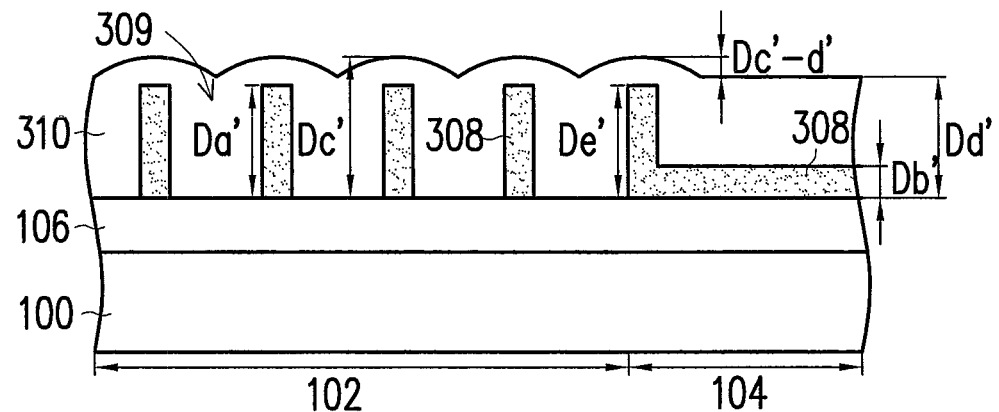
Figure 2C:
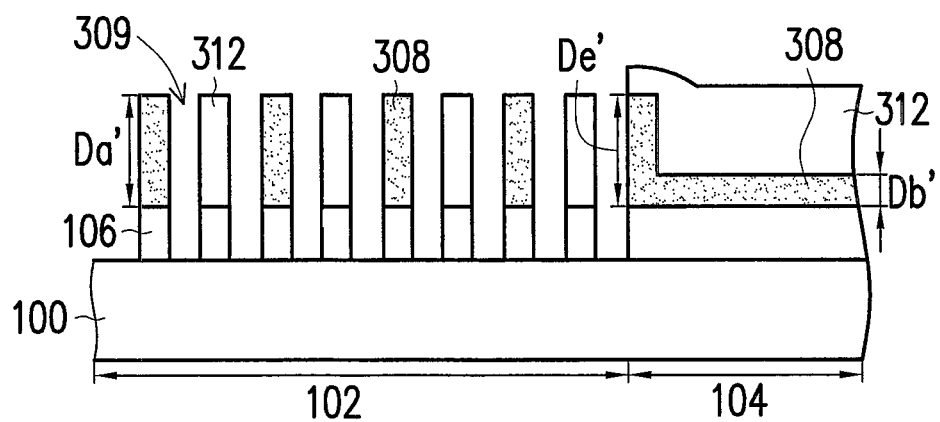

FIGS. 2A-2C illustrate, in a cross-sectional view, a double patterning process according to the second embodiment of this invention, wherein the step shown in FIG 2A follows the step shown in FIG. 1B. The double patterning process of the second embodiment is similar to that of the first one except that the deign of the photomask is different. Hence, the same or a similar element in the second embodiment can include the same or a similar material or be formed with the same or a similar method as in the first embodiment of this invention.

Referring to FIG. 2A, a photomask 40 is used to expose the first photoresist layer 107, and then a development step is performed to form a patterned first photoresist layer 308. The patterned first photoresist layer 308 has therein a plurality of openings 309 in the first area 102. In the second area 104, the patterned first photoresist layer 308 has a first portion that has a thickness Db' less than the thickness Da' of the patterned first photoresist layer 308 in the first area 102, and a second portion that is located adjacent to the first area 102, has a thickness De' larger than Db' and is contiguous with the first portion. In an exemplary embodiment, the ratio of Db' to Da' ranges from 30% to 70%, and De' is substantially equal to Da'. It is noted that the drawings are intended to explain this invention only but not to limit the scope of this invention. Accordingly, the ratio of Db' to Da' as shown in FIG. 2A can be different from that in a real case, and the ratio in a real case can be properly adjusted according to the pattern distribution of the patterned first photoresist layer 308 and/or other factors.

In addition, in an exemplary embodiment, the photomask 40 may be a tri-tone photomask that includes a transparent substrate 400, a first semi-transparent layer 408 and a second semi-transparent layer 410. The transparent substrate 400 has a third area 402 corresponding to the first area 102 of the substrate 100 and a fourth area 404 corresponding to the second area 104 of the substrate 100.

The first semi-transparent layer 408 is disposed on both the third area 402 and the fourth area 404 of the transparent substrate 400, and is patterned in the third area 402 but not patterned in the fourth area 404. The second semi-transparent layer 410 is mostly disposed on the patterned first semi-transparent layer 408 in the third area 402, and has, on the first semi-transparent layer 408 in the fourth area 404, a small portion corresponding to the thicker (De') portion of the patterned first photoresist layer 308 in the second area 104. In the third area 402, the first semi-transparent layer 408 and the second semi-transparent layer 410 have a plurality of openings 412 corresponding to the openings 109 in the first area 102 of the substrate 100 and exposing portions of the transparent substrate 400.

The transparency of the transparent substrate 400, the transparency of the first semi-transparent layer 408 and the transparency of the second semi-transparent layer 410 are different from each other. In an exemplary embodiment, the transparency of the transparent substrate 400 is higher than that of the first semi-transparent layer 408, and the transparency of the first semi-transparent layer 408 is higher than that of the second semi-transparent layer 410. For example, it is possible that the transparency of the first semi-transparent layer 408 ranges from 20% to 60% and that of the second semi-transparent layer 410 ranges from 30% to 70%. The transparent substrate 400 may include quartz or other transparent material. The first semi-transparent layer 408 may be a molybdenum silicon nitride ($MoSi_xN_y$) layer. The second semi-transparent layer 410 may be a $MoSi_xN_y$ layer with a different combination of x and y.

Because the fourth area 404 of the transparent substrate 400 is entirely disposed with the first semi-transparent layer 408 while the openings 412 in the third area 402 expose portions of the transparent substrate 400, the transparency of the fourth area 404 of the photomask 40 is lower than that of the openings 412 in the third area 402 of the photomask 40.

More specifically, the portions of the first photoresist layer 107 corresponding to the second semi-transparent layer 410 of the photomask 40 are slightly exposed and therefore almost not removed in the development. The portions of the first photoresist layer 107 corresponding to the openings 412 of the photomask 40 are highly exposed due to the high transparency of the transparent substrate 400 and thus entirely removed in the development to form the openings 309. The portion of the first photoresist layer 107 corresponding to the fourth area 404 of the photomask 40 is relatively poorly exposed or just slightly exposed due to the lower transparency of the fourth area 404 and the small portion of the second semi-transparent layer 410 and therefore partially removed or almost not removed in the development to form, in the second area 104, a photoresist layer 308 with a thicker (De') portion and a thinner portion (Db').

Though the patterned first photoresist layer 308 is formed with the above method in this embodiment, the method of forming the patterned first photoresist layer 308 is not limited thereto in this invention.

Referring to FIG. 2B, a second photoresist layer 310 is then formed covering the patterned first photoresist layer 308 and filling in the openings 309. Because the thickness Db' of most of the patterned first photoresist layer 308 in the second area 104 is less than the thickness Da' of the patterned first photoresist layer 308 in the first area 102, the second photoresist layer 310 can have a substantially uniform top level in the first area 102 and the second area 104. Though in the figure the thickness Dc' of the second photoresist layer 310 in the first area 102 is greater than the sum Dd' of the thickness Db' of the patterned first photoresist layer 308 and the thickness of the second photoresist layer 310 in the second area 104, this invention is not limited thereto. In another embodiment, the thickness of the second photoresist layer 310 in the first area 102 is less than the sum of the thickness of the patterned first photoresist layer 308 and the thickness of the second photoresist layer 310 in the second area 104.

In an exemplary embodiment, Dd' is within the range of 85% to 95% of Dc'. In another exemplary embodiment, the difference Dc'-d' between Dd' and Dc' is within the range of 50-150 angstroms.

Referring to FIG. 2C, the second photoresist layer 310 is then patterned to form a plurality of patterns 312 in the openings 309 in the patterned first photoresist layer 308 in the first area 102. Thereafter, the target layer 106 is patterned using the patterned first photoresist layer 308 and the patterned second photoresist layer 312 as a mask to form patterns with a higher distribution density than the patterns of the patterned photoresist layer 308 or 312.

According to the second embodiment of this invention, a patterned $1^{st}$ photoresist layer 308 having a less thicknesses (Db'<Da') in most of the second area 104 than in the first area 102 (Da') is formed using the photomask 40, so that the second photoresist layer 310 coated later can have a substantially uniform top level in the entire first area 102. Consequently, the pattern transfer to the second photoresist layer 310 and the underlying target layer 106 is more accurate.

By making the patterned first photoresist layer have different thicknesses in the first area and the second area, the process of each of the above embodiments of this invention allows the second photoresist layer as coated to have a uniform thickness in the entire first area, so that the accuracy of the pattern transfer to the second photoresist layer and the underlying target layer is improved.

Moreover, by adjusting the transparency distribution of the corresponding area of the photomask, the thickness distribution of the patterned first photoresist layer in the second area can be optimized to make the second photoresist layer as coated have an optimal top level uniformity in the entire first area and thereby further improve the accuracy of the pattern transfer to the second photoresist layer and the underlying target layer.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A double patterning process, comprising:
    providing a substrate having a first area and a second area;
    forming a target layer over the substrate;
    forming a patterned first photoresist layer over the target layer, wherein the patterned first photoresist layer has a plurality of first openings and has a first thickness in the first area, at least a first portion of the patterned first photoresist layer in the second area has a second thickness less than the first thickness, and the second thickness is greater than zero; and
    forming a second photoresist layer covering the patterned first photoresist layer and filling in the first openings.

2. The double patterning process of claim 1, wherein the patterned first photoresist layer in the second area further comprises:
    a second portion that is located adjacent to the first area, has a third thickness greater than the second thickness, and is contiguous with the first portion of the patterned first photoresist layer in the second area.

3. The double patterning process of claim 2, wherein the third thickness is substantially equal to the first thickness.

4. The double patterning process of claim 1, wherein forming the patterned first photoresist layer comprises:

forming a first photoresist layer over the substrate;

using a photomask to expose the first photoresist layer, wherein a transparency of an area of the photomask corresponding to the second area is lower than a transparency of areas of the photomask corresponding to the first openings in the first area; and developing the first photoresist layer after the exposure.

5. The double patterning process of claim 4, wherein the photomask comprises a tri-tone photomask.

6. The double patterning process of claim 5, wherein the tri-tone photomask comprises:
  a transparent substrate that has a third area corresponding to the first area of the substrate, and a fourth area corresponding to the second area of the substrate;
  a first semi-transparent layer on the third area and the fourth area of the transparent substrate; and
  a second semi-transparent layer at least on the first semi-transparent layer in the third area,
  wherein the first semi-transparent layer and the second semi-transparent layer in the third area have a plurality of second openings that correspond to the first openings in the first area of the substrate and expose portions of the transparent substrate in the third area.

7. The double patterning process of claim 6, wherein a transparency of the transparent substrate, a transparency of the first semi-transparent layer and a transparency of the second semi-transparent layer are different from each other.

8. The double patterning process of claim 7, wherein the transparency of the transparent substrate is higher than the transparency of the first semi-transparent layer, and the transparency of the first semi-transparent layer is higher that the transparency of the second semi-transparent layer.

9. The double patterning process of claim 8, wherein the transparency of the first semi-transparent layer ranges from 20% to 60%, and the transparency of the second semi-transparent layer ranges from 30% to 70%.

10. The double patterning process of claim 6, wherein the transparent substrate comprises quartz.

11. The double patterning process of claim 6, wherein the first semi-transparent layer and the second semi-transparent layer comprise molybdenum silicon nitride ($MoSi_xN_y$) layers having different combinations of x and y.

12. The double patterning process of claim 1, wherein the second thickness is within a range of 30% to 70% of the first thickness.

13. The double patterning process of claim 1, wherein a sum of the second thickness of the first portion of the patterned first photoresist layer and a thickness of the second photoresist layer in the second area is within a range of 85% to 95% of a thickness of the second photoresist layer in the first area.

14. The double patterning process of claim 1, wherein a difference between a sum of the second thickness of the first portion of the patterned first photoresist layer and a thickness of the second photoresist layer in the second area and a thickness of the second photoresist layer in the first area is within a range of 50-150 angstroms.

15. The double patterning process of claim 1, further comprising:
  patterning the second photoresist layer to form a plurality of patterns in the first openings; and
  patterning the target layer using the patterned first photoresist layer and the patterned second photoresist layer as a mask.

16. The double patterning process of claim 1, wherein the first area comprises a memory cell area, and the second area comprises a peripheral area.

* * * * *